(12) United States Patent
Naraparaju

(10) Patent No.: US 11,512,383 B2
(45) Date of Patent: Nov. 29, 2022

(54) CMAS-RESISTANT PROTECTIVE LAYER

(71) Applicant: Deutsches Zentrum für Luft- und Raumfahrt e.V., Cologne (DE)

(72) Inventor: Ravisankar Naraparaju, Troisdorf (DE)

(73) Assignee: DEUTSCHES ZENTRUM FÜR LUFT-UND RAUMFAHRT E.V., Cologne (DE)

( * ) Notice: Subject to any disclaimer, the term of this patent is extended or adjusted under 35 U.S.C. 154(b) by 1140 days.

(21) Appl. No.: 16/104,406

(22) Filed: Aug. 17, 2018

(65) Prior Publication Data
US 2019/0062898 A1    Feb. 28, 2019

(30) Foreign Application Priority Data

Aug. 24, 2017 (DE) ................ 102017119387.1

(51) Int. Cl.
| | |
|---|---|
| C23C 14/08 | (2006.01) |
| C23C 28/04 | (2006.01) |
| F01D 5/28 | (2006.01) |
| F01D 25/00 | (2006.01) |
| C23C 30/00 | (2006.01) |
| C23C 14/10 | (2006.01) |
| C23C 28/00 | (2006.01) |
| C23C 14/14 | (2006.01) |
| C22C 29/12 | (2006.01) |
| C22C 32/00 | (2006.01) |
| C22C 30/00 | (2006.01) |
| C23C 14/16 | (2006.01) |
| C04B 35/14 | (2006.01) |
| B32B 15/18 | (2006.01) |

(Continued)

(52) U.S. Cl.
CPC ............ *C23C 14/085* (2013.01); *B32B 15/00* (2013.01); *B32B 15/04* (2013.01); *B32B 15/043* (2013.01); *B32B 15/18* (2013.01); *C04B 35/01* (2013.01); *C04B 35/14* (2013.01); *C04B 35/16* (2013.01); *C04B 35/505* (2013.01); *C22C 29/12* (2013.01); *C22C 30/00* (2013.01); *C22C 32/001* (2013.01); *C22C 32/0015* (2013.01); *C23C 14/08* (2013.01); *C23C 14/083* (2013.01); *C23C 14/10* (2013.01); *C23C 14/14* (2013.01); *C23C 14/16* (2013.01); *C23C 28/042* (2013.01); *C23C 28/345* (2013.01); *C23C 28/3455* (2013.01); *C23C 30/00* (2013.01); *C23C 30/005* (2013.01); *F01D 5/28* (2013.01); *F01D 5/284* (2013.01); *F01D 5/288* (2013.01); *F01D 25/005* (2013.01); *F01D 25/007* (2013.01); *C23C 14/35* (2013.01); *F05D 2230/313* (2013.01); *F05D 2230/90* (2013.01); *F05D 2300/175* (2013.01); *F05D 2300/2112* (2013.01); *F05D 2300/2261* (2013.01); *F05D 2300/611* (2013.01); *Y10T 428/1266* (2015.01); *Y10T 428/12597* (2015.01); *Y10T 428/12604* (2015.01); *Y10T 428/12611* (2015.01); *Y10T 428/12618* (2015.01); *Y10T 428/12667* (2015.01); *Y10T 428/12674* (2015.01); *Y10T 428/12931* (2015.01); *Y10T 428/12944* (2015.01); *Y10T 428/2495* (2015.01); *Y10T 428/24959* (2015.01); *Y10T 428/24967* (2015.01); *Y10T 428/26* (2015.01); *Y10T 428/263* (2015.01); *Y10T 428/264* (2015.01); *Y10T 428/265* (2015.01)

(58) Field of Classification Search
CPC ..... C23C 14/085; C23C 14/083; C23C 14/10; C23C 14/35; C23C 14/08; C23C 14/14; C23C 14/16; C23C 28/042; C23C 28/3455; C23C 28/345; C23C 30/00; C23C 30/005; F01D 5/288; F01D 5/28; F01D 5/284; F01D 25/005; F01D 25/007; F05D 2230/313; F05D 2230/90; F05D 2300/175; F05D 2300/2212; F05D 2300/2261; F05D 2300/611; C22C 29/12; C22C 30/00; C22C 32/001; C22C 32/0015; B32B 15/04; B32B 15/043; B32B 15/18; B32B 15/00; Y10T 428/263; Y10T 428/264; Y10T 428/265; Y10T 428/26; Y10T 428/2495; Y10T 428/24967; Y10T 428/24959; Y10T 428/12944; Y10T 428/12931; Y10T 428/12951; Y10T 428/1266; Y10T 428/12667; Y10T 428/12674; Y10T 428/12611; Y10T 428/12618; Y10T 428/12597; Y10T 428/12604; C04B 35/505; C04B 35/01; C04B 35/14; C04B 35/16
See application file for complete search history.

(56) References Cited

U.S. PATENT DOCUMENTS

| | | | |
|---|---|---|---|
| 2011/0027517 A1 | 2/2011 | Kirby et al. | |
| 2011/0027557 A1* | 2/2011 | Kirby ................ | C04B 41/009 428/428 |

(Continued)

FOREIGN PATENT DOCUMENTS

| | | | |
|---|---|---|---|
| DE | 19680503 B3 | 1/2014 | |
| EP | 1029115 B1 | 9/2001 | |

(Continued)

*Primary Examiner* — Michael E. La Villa

(74) *Attorney, Agent, or Firm* — Nexsen Pruet, PLLC; Seth Hudson

(57) ABSTRACT

The present invention relates to a protective layer against CMAS, to a CMAS-resistant article comprising the protective layer according to the invention, and to a process for preparing a corresponding article.

7 Claims, No Drawings

(51) Int. Cl.
*B32B 15/04* (2006.01)
*C04B 35/505* (2006.01)
*C04B 35/16* (2006.01)
*B32B 15/00* (2006.01)
*C04B 35/01* (2006.01)
*C23C 14/35* (2006.01)

(56) References Cited

U.S. PATENT DOCUMENTS

2011/0076410 A1 3/2011 Skoog et al.
2016/0115819 A1 4/2016 Nayak et al.
2017/0145836 A1 5/2017 Sivaramakrishnan et al.

FOREIGN PATENT DOCUMENTS

WO 2015/130362 A2 9/2015
WO 2017/031163 A1 2/2017

* cited by examiner

CMAS-RESISTANT PROTECTIVE LAYER

FIELD OF THE INVENTION

The present invention relates to a protective layer against CMAS, to a CMAS-resistant article comprising the protective layer according to the invention, and to a process for preparing a corresponding article.

BACKGROUND OF THE INVENTION

"CMAS" describes calcium, magnesium, aluminum and silicon or silicate compounds, which can be problematic on hot components, especially in aerospace technology. "CMAS" generally describes contaminants that typically contain calcium oxide, magnesium oxide, aluminum oxide, and silicon oxide. Typically, this is sand. However, CMAS also comprises ash particles, which may be of volcanic origin, for example, within the meaning of the present invention.

In the aerospace field, turbines are used for propulsion. For these turbines to withstand the prevailing temperatures in operation of 1200° C. or more, and also to protect the actual turbine from outer influences, these are usually provided with a heat insulation layer (TBC "thermal barrier coating"). The individual components of turbines have a particular basic structure. This basic structure, i.e., the corresponding component, consists of a superalloy, usually a nickel-based superalloy. The latter is covered with an adhesion-promoting layer that contains aluminum. This is an aluminum reservoir from which $Al_2O_3$ is formed in operation. The $Al_2O_3$ is already a first protective layer, ensuring the bonding to the actual basic structure. Then, the heat insulation layer is applied to said adhesion-promoting layer. The former has a low heat conductivity, which results in a strong temperature gradient in the interior. The heat insulation layer is usually made of porous oxides. Depending on the type of coating process, they have different porosities. Such porous structure provide for thermal stability, since the material is capable in this way of responding to temperature variations and to the temperature gradient that prevails in operation.

Now, when the heat insulation layer comes into contact with CMAS in operation, temperatures of clearly above 1200° C. prevail at the outside of the TBC. At such temperatures, CMAS particles will melt, so that they can infiltrate into the pores of the TBC. Then, when the turbine is cooled down after operation, for example, the CMAS will solidify within the TBC. Thus, the porous structure of the TBC is lost, which causes the thermal stability of the TBC to decrease. In the medium term, this leads to failure of the TBC.

In addition to superalloys provided with a thermal insulation layer, other materials are also tested for turbines and comparable articles. For example, silicon carbide (SiC) is considered a suitable material. As compared to superalloys, silicon carbide has the advantage of being significantly more stable towards temperature variations. However, it may be attacked, for example, by atmospheric humidity. Here, so-called "environmental barrier coatings" (EBC) are employed for protection. Much like the previously described TBS, corresponding EBCs have a porous structure. In operation, CMAS may infiltrate in these as well. This also leads to failure of the EBCs and failure of the turbine. Typical EBCs consist of yttrium monosilicates or yttrium disilicates.

Different protective layers intended to prevent the infiltration of CMAS into the TBCs are described in the prior art, for example, in U.S. Pat. No. 9,194,242 B2, U.S. Pat. No. 7,785,722 B2, U.S. Pat. No. 8,062,759 B2, or U.S. Pat. No. 8,859,052 B2. CMAS-resistant TBCs are described in U.S. Pat. No. 8,658,291 B2. The layers described react with the CMAS. This leads to a reaction in which products are formed that have a higher melting temperature as compared to CMAS, whereby the infiltration of CMAS into the porous structure of the TBC can be at least slowed down. However, this at the same time leads to a degradation of the protective layer, so that the latter must be renewed on a regular basis.

Further, layers intended to prevent wetting of the TBCs or EBCs by the liquid CMAS are also described. For example, Pd—Ag, Pd, Pt, $MoSi_2$ or $ZrSiO_4$ are suitable. Rare earth metal zirconates also have such properties. Zirconates, especially in connection with rare earth metals, have the effect that crystalline phases form from the mixture of CMAS and the oxides employed. These crystalline phases penetrate the surface of the TBCs or EBCs and thereby prevent the CMAS from completely infiltrating into the corresponding protective layers. However, the infiltration cannot be prevented completely.

The known CMAS protective layers have the disadvantage of not being stable in the long term. In addition, they can be employed only up to particular temperatures, because otherwise the phases formed will also liquefy and penetrate into the TBC/EBC.

BRIEF SUMMARY OF THE INVENTION

Thus, there is a need for a protective layer that reduces, and prevents if possible, the infiltration of CMAS into porous layers. This protective layer is to be stable also at temperatures of clearly above 1200° C. and especially at 1200° C. or more, and prevent the infiltration of CMAS even at such temperatures. At the same time, the protective layer is to have a good adhesion to other layers, the latter being thermal insulation layers or EBCs, in particular.

It has been found that the object of the present invention is achieved by a protective layer against CMAS, characterized by consisting of oxides of iron, yttrium and silicon.

DETAILED DESCRIPTION OF THE INVENTION

It has further been found that a protective layer that exclusively includes iron oxide, yttrium oxide and silicon oxide has properties that prevent the infiltration of CMAS into porous layers, such as TBC or EBC, in particular. At the same time, a protective layer according to the invention has a good adhesion to TBC or EBC, so that the protective layer is stable over an extended period of time.

Preferably, the proportion of oxides of yttrium in the protective layer is within a range of from 25 atomic percent to 85 atomic percent, especially within a range of from 30 atomic percent to 75 atomic percent, more preferably within a range of from 40 atomic percent to 70 atomic percent. The proportion of oxides of silicon is especially within a range of from 2 atomic percent to 35 atomic percent, preferably from 5 atomic percent to 30 atomic percent, more preferably from 5 atomic percent to 25 atomic percent, or up to 20 atomic percent. More preferably according to the invention, the proportion of iron oxides in the protective layer is within a range of from 1 atomic percent to 35 atomic percent, especially from 2 atomic percent to 30 atomic percent, more preferably from 2 atomic percent to 20 atomic percent. It has been found that the above mentioned proportions are particularly suitable for forming a CMAS protective layer. The protective layer according to the invention consists only of iron, yttrium and silicon oxides. Other oxides or other additives, such as rare earths, as described, for example, in U.S. Pat. No. 9,194,242 B2 or U.S. Pat. No. 7,785,722 B2, are not contained presently, and also are not necessary to ensure protection against CMAS.

Preferably, the iron oxide is $Fe_2O_3$, the silicon oxide is $SiO_2$, and the yttrium oxide is $Y_2O_3$ in the layer according to the invention as described herein.

Further, the present protective layer has no particular crystal structure. This enables the protective layer to be applied by a wide variety of coating methods as described in the prior art. No particular conditions are to be observed. Thus, the coating can be applied, for example, with PVD methods, such as magnetron atomizers or electron beam vaporization (EB-PVD), but also by means of thermal spraying methods, such as atmospheric plasma spraying (APS), or vacuum plasma spraying (VPS). What is critical for the choice of the coating method may be constructional limitations and the cost associated with the method.

Preferably according to the invention, the protective layer has a layer thickness of from 10 μm to 200 μm, especially from 15 μm to 150 μm, preferably from 20 μm to 100 μm. The protective layer according to the invention reacts with the liquid CMAS and forms a crystalline layer above or immediately on the underlying layer or surface. For this reaction, a layer thickness of at least 5 μm is required. As soon as such a crystalline layer has formed immediately on the underlying surface or coating, the reaction takes place exclusively in the overlying regions of the protective layer. Thus, in contrast to the protective layers described in the prior art, CMAS cannot penetrate into porous structures below the protective layer according to the invention. Once this reaction is completed, no other reaction takes place that would affect the underlying regions in any way. A layer thickness of 10 μm is sufficient to ensure long-term protection. Layer thicknesses of more than 200 μm cause a high increase of the total layer thickness, which may be undesirable depending on the field of application. In addition, the accompanying cost and the weight are also to be considered besides the thickness. Layer thicknesses of from 10 μm to 100 μm or from 15 μm to 50 μm are sufficient to ensure long-term protection.

In another embodiment, the object of the present invention is achieved by a CMAS-resistant article. According to the invention, this article includes a basic structure made of a refractory material with a surface, a first coating on this surface, and a protective layer as described above that is applied immediately to the first layer. Thus, "CMAS-resistant" means that CMAS have no adverse influence on the corresponding article in operation or use.

An "article" within the meaning of the present invention is any article that is operated at high temperatures and exposed to different external influences. For example, the article is a turbine, especially a gas turbine, a turbine blade, or a turbine paddle, or an inliner on the combustion chamber of a turbine, especially a high-pressure turbine. The corresponding article also determines the basic structure. "Turbine" or "gas turbine" or "high-pressure turbine" comprises all components thereof that are exposed to high temperatures of 1000° C. or more, especially 1200° C. or more.

In particular, the high-temperature material is a superalloy in operation, more preferably a nickel-based superalloy or SiC.

In particular, the first coating that is present on the refractory material is a heat insulation layer (thermal barrier coating, TBC), or an EBC. Corresponding protective layers are described in the prior art, and known to the skilled person.

In another embodiment, the present invention relates to a process for preparing a CMAS-resistant article, characterized in that the protective layer is applied to the first coating by means of sputter technology or PVD. In principle, any method of applying the protective layer is possible, such as EB-PVD, APS, VPS, HVOF, or sputtering methods. Differences in CMAS resistance caused by different application methods cannot be observed.

In the following Example, the present invention is described in a non-limiting way.

EXAMPLE

A protective layer having a thickness of 20 μm was applied to substrates of aluminum oxide using magnetron sputtering. The proportion of yttrium oxide in the protective layer according to the invention was from 48 atomic percent to 53 atomic percent, the proportion of silicon oxide was from 12 atomic percent to 15 atomic percent, the proportion of iron oxide was from 2 atomic percent to 10 atomic percent.

The coatings were heated at a temperature of 700° C. over a period of 10 hours, and subsequently heated at a temperature of 1150° C. for one hour.

Synthetic CMAS powder (22% by weight CaO, 8% by weight O, 8% by weight MgO, 18 % by weight $Al_2O_3$, 40% by weight $SiO_2$, 10% by weight FeO, and 2% by weight $TeO_2$) was applied to the protective layer. The specimen was heated at a temperature of 1250° C. for five minutes, and analyzed by means of scanning electron microscopy (SEM) and energy-dispersive X-ray spectroscopy (EDS).

For comparison, an EB-PVD heat insulation layer (7 YSZ, a zirconium oxide stabilized with 7% by weight yttrium oxide) on a substrate of aluminum oxide was treated with the same synthetic CMAS powder, and also heated at a temperature of 1250° C. for five minutes. Here too, an analysis by means of scanning electron microscopy and EDS was performed.

While the protective layer according to the invention had the effect that the liquefied CMAS could not infiltrate into the TBC, the infiltration of CMAS, especially of compounds containing calcium and silicon, into the porous structure of TBC could be clearly seen in the EDS in the comparative example.

Thus, the Examples confirm that the protective layer according to the invention is capable of preventing the infiltration of CMAS into porous structures, such as those of a TBC.

The invention claimed is:

1. A protective layer against CMAS, characterized in that said protective layer consists of oxides of iron, yttrium and silicon.

2. The protective layer according to claim 1, characterized in that the layer thickness of the protective layer is from 10 μm to 200 μm.

3. A CMAS-resistant article, comprising:
   a basic structure made of a refractory material with a surface,
   a first coating on this surface, and
   a protective layer consisting of oxides of iron, yttrium and silicon that has been applied to this first coating.

4. The article according to claim 3, characterized by being a turbine or an inliner on the combustion chamber.

5. The article according to claim 3, characterized in that said refractory material comprises an Ni-based superalloy or SiC.

6. The article according to claim 3, characterized in that said first coating is a thermal insulation layer (TBC) or environmental barrier coating (EBC).

7. A process for preparing an article according to claim 3, characterized in that the protective layer is applied to the first coating by means of sputter technology or PVD.

* * * * *